(12) United States Patent
Okumura

(10) Patent No.: US 7,709,904 B2
(45) Date of Patent: May 4, 2010

(54) THIN FILM TRANSISTOR SUBSTRATE AND METHOD FOR MANUFACTURING THE SAME

(75) Inventor: Hiroshi Okumura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/773,333

(22) Filed: Feb. 9, 2004

(65) Prior Publication Data

US 2004/0195568 A1 Oct. 7, 2004

(30) Foreign Application Priority Data

Feb. 20, 2003 (JP) .............................. 2003-042083

(51) Int. Cl.
*H01L 29/786* (2006.01)
(52) U.S. Cl. ..................... 257/392; 257/66; 257/72; 257/250
(58) Field of Classification Search .................. 257/59, 257/72, 351, 355–356, 390–395, 406, 250, 257/392
See application file for complete search history.

(56) References Cited

U.S. PATENT DOCUMENTS

| | | | |
|---|---|---|---|
| 5,053,849 A * | 10/1991 | Izawa et al. ................. 257/401 |
| 5,610,082 A * | 3/1997 | Oh ............................. 438/160 |
| 5,757,050 A * | 5/1998 | Adler et al. ................. 257/347 |
| 5,914,498 A * | 6/1999 | Suzawa et al. ............... 257/66 |
| 6,048,795 A * | 4/2000 | Numasawa et al. .......... 438/685 |
| 6,124,153 A * | 9/2000 | Lee et al. .................... 438/151 |
| 6,133,609 A * | 10/2000 | Nakamura ................... 257/347 |
| 6,255,180 B1 * | 7/2001 | Smith .......................... 438/301 |
| 6,507,069 B1 * | 1/2003 | Zhang et al. ................. 257/336 |
| 2002/0195604 A1 * | 12/2002 | Segawa et al. ............... 257/72 |
| 2003/0025127 A1 * | 2/2003 | Yanai et al. .................. 257/158 |

FOREIGN PATENT DOCUMENTS

| | | |
|---|---|---|
| JP | 5-335573 A | 12/1993 |
| JP | 6-244209 | 9/1994 |
| JP | 8-250742 A | 9/1996 |
| JP | 11-307777 A | 11/1999 |

(Continued)

OTHER PUBLICATIONS

Wolf, S., "Silicon Processing in the VLSI Era", vol. 3—The submicron MOSFET, Lattice Press, Sunset Beach, California (USA) (1995) (ISBN: 0-961672-5-3), pp. 592-594.*

(Continued)

*Primary Examiner*—Johannes P Mondt
(74) *Attorney, Agent, or Firm*—Sughrue Mion, PLLC

(57) ABSTRACT

A thin film transistor substrate is provided including a first thin film transistor and a second thin film transistor. The first thin film transistor comprises a first active layer, a first gate insulating film, and a first gate electrode. The second thin film transistor comprises a second active layer formed, a second gate insulating film, and a second gate electrode. A thickness of the second gate insulating film is larger than a thickness of the first gate insulating film, the second active layer has at least two impurity doping regions which overlap the second gate electrode, the first active layer has at least two impurity doping regions formed in a self-aligning manner with respect to the first gate electrode, and the second gate electrode comprises a semiconductor layer.

10 Claims, 9 Drawing Sheets

FOREIGN PATENT DOCUMENTS

| | | |
|---|---|---|
| JP | H11-307777 A | 11/1999 |
| JP | 2000-058849 A | 2/2000 |
| JP | 2000-353811 A | 12/2000 |
| JP | 2003-017502 A | 1/2003 |
| JP | 2003-45892 A | 2/2003 |
| JP | 2003-045892 A | 2/2003 |

OTHER PUBLICATIONS

Computerized Translation of Nakamura, Osamu (JP 2003-017502 A) as previously and presently cited.*

* cited by examiner

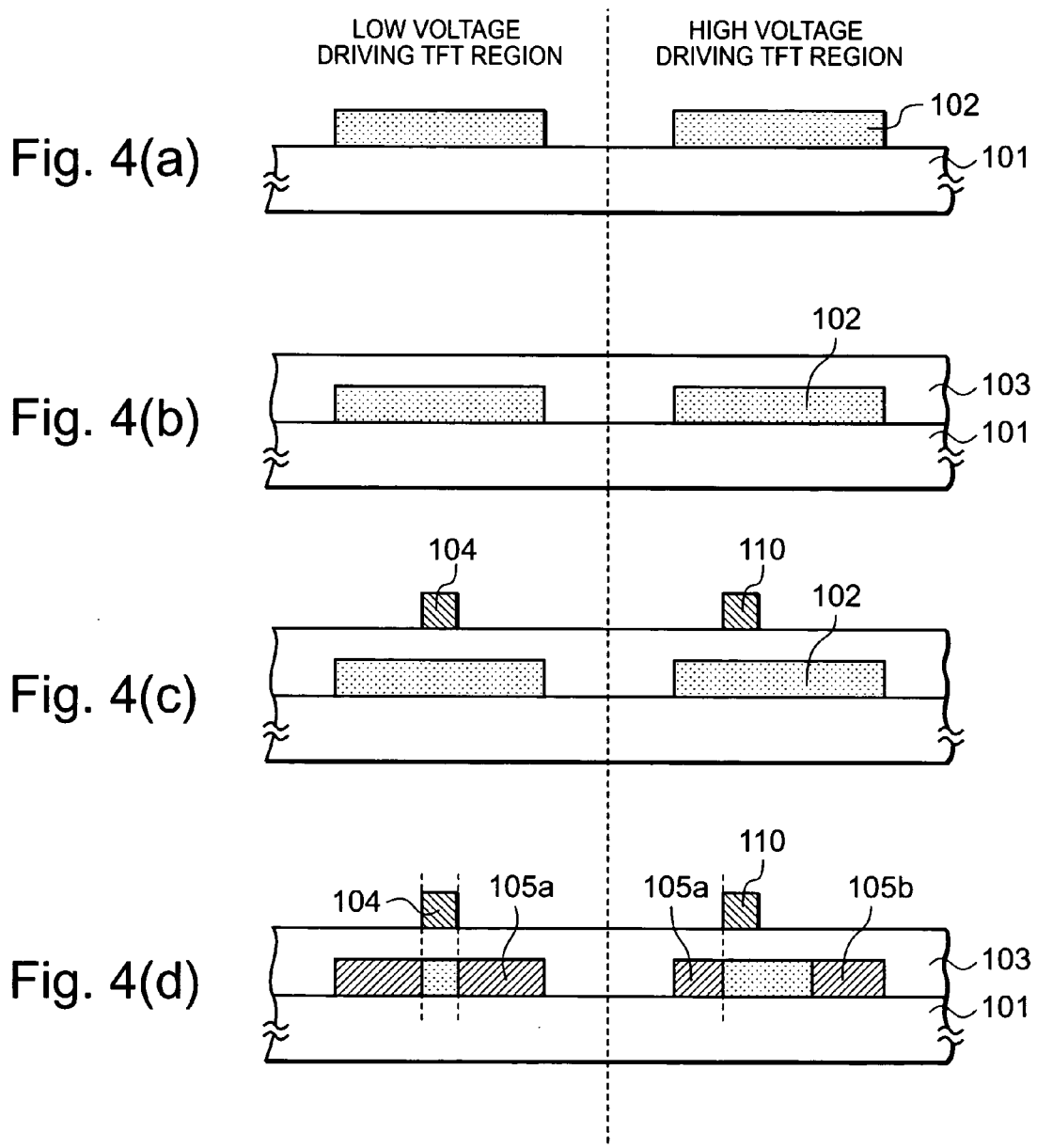

THIN FILM TRANSISTOR SUBSTRATE AND METHOD FOR MANUFACTURING THE SAME

BACKGROUND OF THE INVENTION

1. Field of the Invention

The present invention relates to a thin film transistor substrate and a method for manufacturing the same, and more particularly, to a thin film transistor substrate in which plural types of thin film transistors are formed on an insulating substrate, the plural types of transistors differing in driving voltage, for example, a driver circuit, a power source booster circuit, and a level shift circuit.

2. Description of the Related Art

In recent years, by using polysilicon (poly-Si) thin film transistors (TFTs), pixel switch elements and also driver circuits can be formed on the same substrate in a liquid crystal device, organic EL display device, or the like which is formed on a low-cost glass substrate. A lower operation voltage is desired in the driver circuit for a lower power consumption. However, a voltage at some level or more is required in pixel operation. Therefore, there is required a technique in which plural types of TFTs with different operation voltage are mixedly fabricated on a substrate to form a driver circuit including a power source booster circuit, a level shift circuit, or the like.

Generally, to form TFTs having different operation voltages, a technique of changing a gate insulating film in thickness is adopted considering a withstand voltage. For example, Japanese published application H05-335573A (prior art 1) discloses a technique, as shown in FIG. 1, in which island-like active layers 302 are formed on an insulating substrate 301. Impurity doping regions 305a, 305b that are to be source/drain regions are formed in the active layers, a gate insulating film 303 is formed on the entire surface, and a gate electrode 304 of a peripheral circuit TFT 401 is formed on the gate insulating film. Then, a first interlayer insulating film 306 is formed on the entire surface, and a gate electrode 307 of a matrix circuit (switching) TFT 402 is formed. Thereafter, a second interlayer insulating film 308 is deposited, and metal wirings 309 are formed.

Japanese published application 2003-45892 (prior art 2) discloses a technique in which a low voltage driving TFT and a high voltage driving TFT are formed on an insulating substrate, according to a similar way to the technique disclosed in the prior art 1. In the low voltage driving TFT, a channel region between a source and drain regions does not overlap a gate electrode, whereas in the high voltage driving TFT the channel region overlap the gate electrode.

Further, Japanese published application H08-250742A (prior art 3) discloses a technique in which island-like active layers are formed on an insulating substrate, a first gate insulating film is formed selectively on the island-like active layer of a switching TFT. Then, a second gate insulating film is deposited on the entire surface, a gate electrode of the switching TFT and a gate electrode of a peripheral circuit TFT are formed simultaneously, and doping of impurity ions and an activation process with the use of laser light are performed.

However, the method disclosed in prior art 3 involves a problem in that an etching step of an insulating film which includes a photolithography step is additionally provided. Further, in a process of manufacturing a TFT, each of an impurity doping step and an activation step significantly depends on the thickness of the insulating film on the active layer. Thus, in the case where the respective steps are performed with insulating films (gate insulating films) that differ in thickness, it is difficult to achieve satisfactory circuit operation because it is difficult to match TFT characteristics, particularly, threshold voltages among plural kinds of TFTs.

In the impurity doping step, there arises a problem in that the number of photolithography steps and the number of impurity doping steps increase when impurities are doped in a self-aligning manner as to all the plural kinds of TFTs. Further, when the thickness of the insulating film on the active layer exceeds 120 nm, there also arises a problem in that phosphorous is difficult to be doped because phosphorous is low insulating-film transmission capability. In order to avoid the above-mentioned problems, impurity may be doped simultaneously with respect to the plural kinds of TFTs immediately after the formation of the active layers, as disclosed in, for example, the prior art 1. However, in the case where the impurity is not doped in a self-aligning manner, an overlap or offset structure is invited by gate alignment, which leads to variation in threshold voltage. Further, the overlap structure causes an increase of a parasitic capacitance, and the offset structure causes lowering TFT ON current. Both of the structures invite lowering a circuit operation frequency.

In the activation step, a general thermal activation method with the use of a furnace requires a processing time of 10 hours or more, and provides a low throughput. Thus, an activation method with photoirradiation such as a laser activation method or a lamp heating method or a rapid heating method in which a gas heated at approximately 600° C. or more is sprayed, is used as an activation method with a high throughput. However, the above activation method with a high throughput involves large thermal shock, and thus, this provides a problem in that a gate electrode is likely to be peeled off. Further, a cooling effect on the active layer by the insulating film directly thereabove is extremely large under the influence of thermal diffusion compared with the thermal activation method. This causes a problem in that thermal hysteresis is changed depending on the insulating film thickness, which leads to change a maximum elevated temperature of the active layer. Thus, besides a problem by varying the activation rates, particularly in a low-temperature poly-Si TFT on a glass substrate manufactured at approximately 600° C. or less, secondary effects in the activation step, such as a decrease in defect density of a poly-Si film and a densification of the insulating film, are influenced and varied. Moreover, in the laser activation method, there arises a problem in that a light reflectance changes depending on the insulating film thickness. That is, in the prior art 3, when the insulating films on the active layer differ in thickness in the activation step, a difference develops in the activation rate, thereby causing a channel region and an impurity doping region in the active layer to be formed with different sheet resistances. As a result, there are formed TFTs differing in mobility, threshold voltage, reliability, and the like.

The method can be adopted, in which impurity doping and activation are conducted before the formation of an insulating film as disclosed in the prior art 1, in order to avoid change in layer resistance of the channel region and the impurity doping region depending upon the insulating film thickness. However, in this case, the above-described secondary effects in the activation step cannot be obtained.

SUMMARY OF THE INVENTION

An object of the present invention is to provide a thin film transistor substrate that includes at least two kinds of thin film transistors, having different thickness of insulating films, which involve circuit operation with high reliability, and a method for manufacturing the thin film transistor substrate.

According to a first embodiment of the present invention, a thin film transistor substrate comprises an insulating substrate, a first thin film transistor formed above the insulating substrate, and a second thin film transistor formed above the insulating substrate. The first thin film transistor comprises a first active layer formed above the insulating substrate, a first gate insulating film formed on the first active layer, and a first gate electrode formed on the first gate insulating film. The second thin film transistor comprises a second active layer formed above the insulating substrate, and a second gate insulating film formed on the second active layer, a second gate electrode formed on the second gate insulating film. According to the first embodiment, a thickness of the second gate insulating film is larger than a thickness of the first gate insulating film, the second active layer has at least two impurity doping regions which overlap the second gate electrode, the first active layer has at least two impurity doping regions formed in a self-aligning manner with respect to the first gate electrode, and the second gate electrode comprises a semiconductor layer.

According to another exemplary embodiment of the present invention, a thin film transistor substrate comprises: an insulating substrate; a low voltage driving thin film transistor formed above said insulating substrate, wherein said low voltage driving thin film transistor comprises a first active layer formed above said insulating substrate, a first gate insulating film formed on said first active layer, and a first gate electrode driven at low voltage formed on said first gate insulating film; and a high voltage driving thin film transistor formed above said insulating substrate, wherein said high voltage driving thin film transistor comprises a second active layer formed above said insulating substrate, and a second gate insulating film formed on said second active layer, a second gate electrode driven at high voltage formed on said second gate insulating film, wherein said second gate insulating film comprises said first gate insulating film and a gate cover film formed above said first gate insulating film, wherein said second active layer has at least two impurity doping regions which overlap said second gate electrode, wherein said first active layer has at least two impurity doping regions formed in a self aligning manner with respect to said first gate electrode, wherein said high voltage driving thin film transistor further comprises a third gate electrode driven at low voltage, wherein a gate length of said third gate electrode is shorter than a gate length of said second gate electrode, wherein said third gate electrode is formed between said second active layer and said second gate electrode and on the first gate insulating film, wherein said third gate electrode is formed of the same material as said first gate electrode, and wherein said third gate electrode has the same thickness as said first gate electrode.

According to a second embodiment of the present invention, a method for manufacturing a thin film transistor substrate comprises providing an insulating substrate, forming a first active layer above the insulating substrate, forming a second active layer above the insulating substrate, forming a first gate insulating film on the first active layer and on the second active layer, and forming a first gate electrode above the first active layer. The method for manufacturing a thin film transistor substrate also comprises forming impurity doping regions in the first active layer by doping impurity, the impurity doping regions formed in a self-aligning manner with respect to the first gate electrode, forming impurity doping regions in the second active layer by doping impurity, forming a gate cover film above the first gate insulating film and the first gate electrode, and forming a second gate electrode above the second active layer. The second gate electrode includes at least two portions, and each of the two portions overlaps each one of the impurity doping regions in the second active layer, and the second gate electrode includes at least a semiconductor layer.

BRIEF DESCRIPTION OF THE DRAWINGS

FIGS. 4(a) to (d) are sectional views showing method steps according to a second the second embodiment of the present invention.

DETAILED DESCRIPTION OF THE INVENTION

First Embodiment

FIG. 2 and FIG. 3 are sectional views showing method steps according to a first embodiment of the present invention. In the formation of a low voltage driving TFT and a high voltage driving TFT on an insulating substrate 101, at first, island-like active layers 102=102a, b are formed by patterning a poly-Si film formed by a laser annealing method (FIG. 2(a)). Next, an insulating film 103 is deposited (FIG. 2(b)). Here, the insulating film 103 serves as a gate insulating film of the low voltage driving TFT. Next, a first gate electrode 104 is formed (FIG. 2(c)). Here, it may be effective for lowering a TFT threshold voltage with high uniformity that the first gate electrode 104 takes a two-layer structure having a non-single crystal semiconductor for the lower layer, which is deposited by a plasma enhanced CVD method, and metal or metal silicide for the upper layer.

Figure 1:
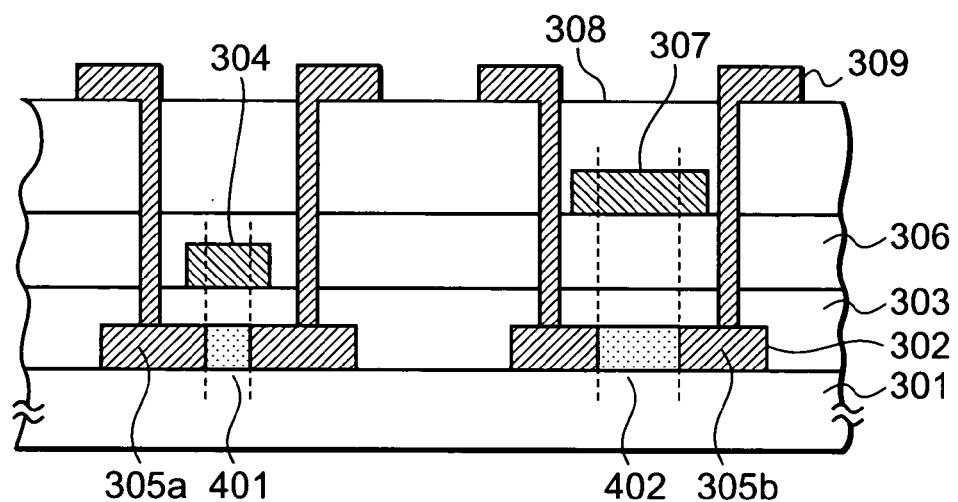
FIG. 1 is a sectional view of a TFT in a conventional example.
Figure 2A:
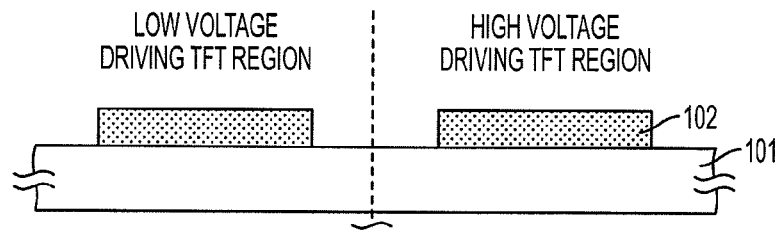
FIGS. 2(a) to (d) are sectional views showing method steps according to a first embodiment of the present invention.
Figure 2B:
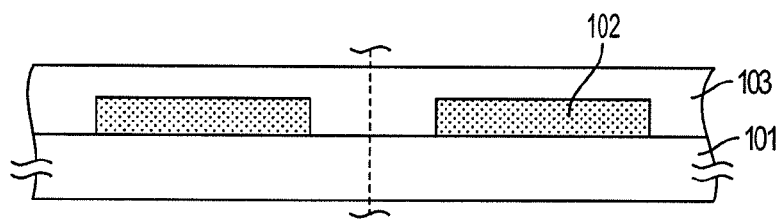
Figure 2C:
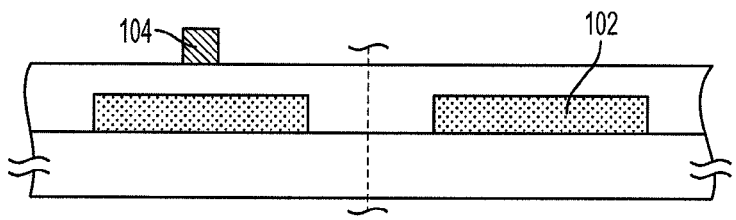
Figure 2D:
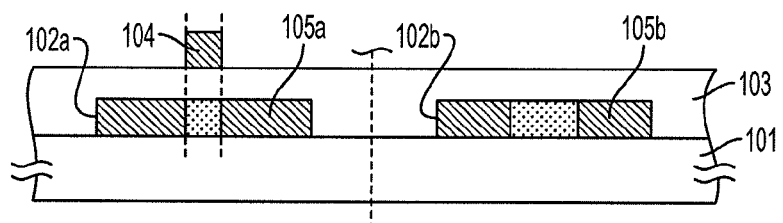

Next, impurities are doped into the island-like active layers 102, thereby forming impurity doping regions 105a (FIG. 2(d)). Here, in the low voltage driving TFT, an impurity doping region 105a is formed in a self-aligning manner by utilizing the gate electrode 104. In the high voltage driving TFT, the impurity doping region 105b is formed to have an overlap structure with the use of, for example, a photoresist film as a mask in consideration of alignment accuracy in subsequent formation of a second gate electrode 107. In the case where a circuit is formed by mixedly providing TFTs that adopt plural kinds of driving voltages, it is advantageous for lower power consumption of the circuit that main parts corresponding to a logic circuit, a shift register, and the like are structured by low voltage driving TFTs. A level shift circuit is arranged on the side as close as possible to an output, and high voltage driving TFTs are used mainly for the level shift circuit, an output buffer, and the like. Therefore, it is better to avoid a parasitic capacitance in the low voltage driving TFT, but the parasitic capacitance does not present a large problem depending on a circuit design in the high voltage driving TFT. However, in the high voltage driving TFT an offset structure may cause lowering a driving capability. In the first embodiment of the invention, the low voltage driving TFT is of self alignment type while the high voltage driving TFT is of overlap type. Therefore, there can be formed a thin film transistor substrate including a circuit which is constituted of plural kinds of TFTs with a high throughput and which can be driven at high speed with low power consumption. The impurity doping regions 105a and 105b each may have an LDD (lightly doped drain) structure with a low concentration region. In the technique disclosed in the prior art 1, both of the TFTs takes an overlap structure, as shown in FIG. 1, and thus, there cannot be obtained a circuit with high-speed operation under the influence of the parasitic capacitance.

Figure 3A:
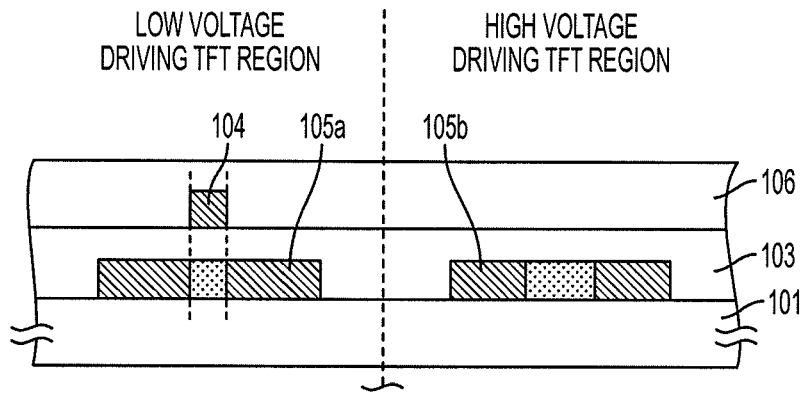
FIGS. 3(a) to (c) are sectional views showing method steps according to the first embodiment of the present invention.
Figure 3B:
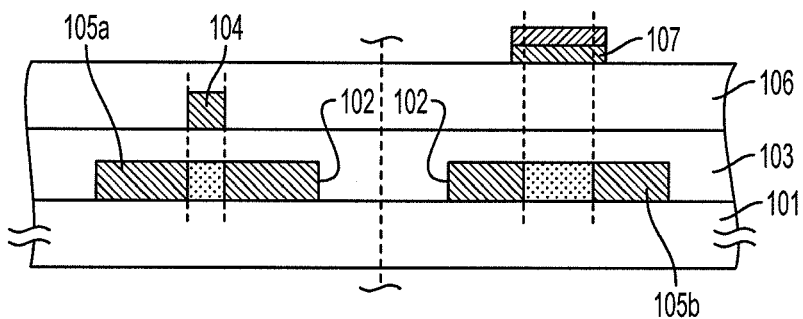

Next, a gate cover film 106 is deposited (FIG. 3(a)). The gate cover film 106 helps for protecting the gate electrode in using an activation method with a high throughput, and serves as a gate insulating film of the high voltage driving TFT together with the insulating film 103. Subsequently, impurities are activated by photoirradiation or a rapid heating method in which a heated gas is sprayed. In this heat treatment, the gate cover film 106 avoids film peeling of the first gate electrode 104. Further, an activation rate of the impurities and the level of densification of the insulating film 103 and the gate cover film 106 are the same between both the TFTs. Therefore, a threshold voltage and reliability are substantially the same between both the TFTs.

Subsequently, hydrogenation may be performed. Next, a second gate electrode 107 is formed to have an overlap structure with respect to the impurity doping region 105b (FIG. 3(b)). Here, the second gate electrode 107 may be formed of a layer including a semiconductor layer.

In the hydrogenation step, passivation efficiency of unpaired electrons in the active layer may be changed depending on the thickness of the insulating film according to the influence of diffusion of hydrogen atoms or hydrogen radicals. That is, in the hydrogenation step when the insulating films on the active layer differ in thickness, as disclosed in the prior art 1 and the prior art 2, a difference develops in the passivation efficiency of unpaired electrons, which leads to a difference in sheet resistance of the channel region and the impurity doping region in the active layer. The prior art 1 and prior art 2 do not indicate any problems with the hydrogen step in that there are formed TFTs differing in various characteristics such as TFT threshold values. Further, the TFT reliability also relies on the passivation efficiency of unpaired electrons. Therefore, the TFT with a thicker insulating-film thickness invites earlier deterioration. However, in this embodiment, a time of the hydrogenation step can be reduced by using the semiconductor layer for the second gate electrode 107, because a source gas for formation of the semiconductor layer contains hydrogen, the defects in the insulating film 103 is subjected to passivation due to hydrogen radicals in the formation of semiconductor layer.

In addition, the second gate electrode 107 may be a two-layer structure for reduction in time for the above-mentioned hydrogenation step besides lowering and uniformity of a TFT threshold voltage. The two-layer structure includes a non-single crystalline semiconductor, which is deposited by a plasma enhanced CVD method, for the lower layer, and metal or metal silicide for the upper layer. The defects in the island-like active layers 102, the insulating film 103, and the gate cover film 106 are subjected to passivation due to hydrogen radicals in the formation of the non-single crystalline semiconductor thin film with the plasma enhanced CVD method. The crystalline semiconductor layer may be formed according to methods, for example, disclosed in Japanese published application H11-307777A.

Figure 3C:
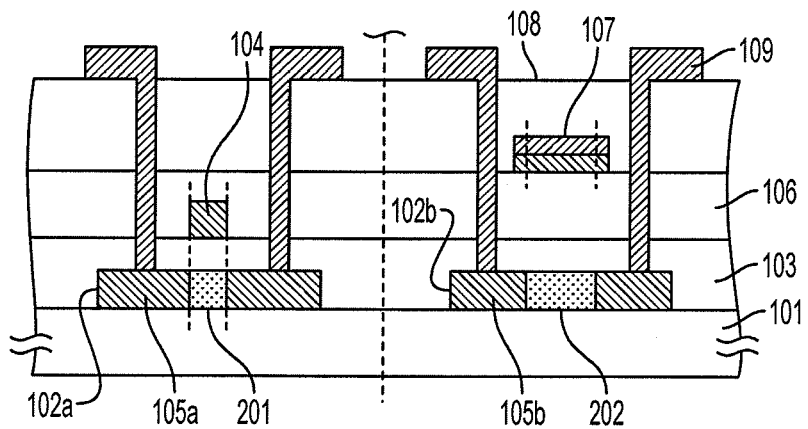

Next, an interlayer insulating film 108 is deposited, contact holes are formed, and metal wirings 109 are formed, whereby the low voltage driving TFT 201 and the high voltage driving TFT 202 are formed (FIG. 3(c)). In this embodiment, to form the high voltage driving TFT in addition to forming the low voltage driving TFT, the only additional step is the forming of second gate electrode 107. Additional film formation step, etching step, impurity doping step, and the like, are not required. Thereafter, various wirings, electrodes, interlayer films, and the like may be formed, as a result of which a TFT substrate is formed.

The method of simultaneously forming two kinds of TFTs is described here, however, in the case of three or more kinds of TFTs, a second gate cover film, a third gate electrode, a third gate cover film, and a fourth gate electrode may be formed sequentially in the steps subsequent to the step of FIG. 3(c). Here, for densification and passivation of defects of the second gate cover film and the following electrodes and films, the third gate electrode and the following films and electrodes each may be formed such that their lower layer contains the non-single crystalline semiconductor deposited at 300° C. or more by the plasma enhanced CVD method.

Further, the low voltage driving TFT 201 and the high voltage driving TFT 202 each may be either of n-channel type and p-channel type. Moreover, the low voltage driving TFT 201 and the high voltage driving TFT 202 of both conductivity types may be formed on the same insulating substrate.

As described above, the source/drain regions of the low voltage driving TFT are formed in a self-aligning manner, and the source/drain regions of the high voltage driving TFT are formed to be overlapped with the gate electrode. Thus, it is realized that the operation speed of the low voltage driving TFT is not lowered, and the driving capability of the high voltage driving TFT is not lowered. Also, the impurity doping and activation and the hydrogenation process can be performed under the same conditions between the active layers of both the TFTs. Therefore, there can be formed with the high throughput the thin film transistor substrate including plural kinds of the thin film transistors, in which threshold value characteristics are matched, and which the circuit operation is highly reliable.

Second Embodiment

Figure 5A:
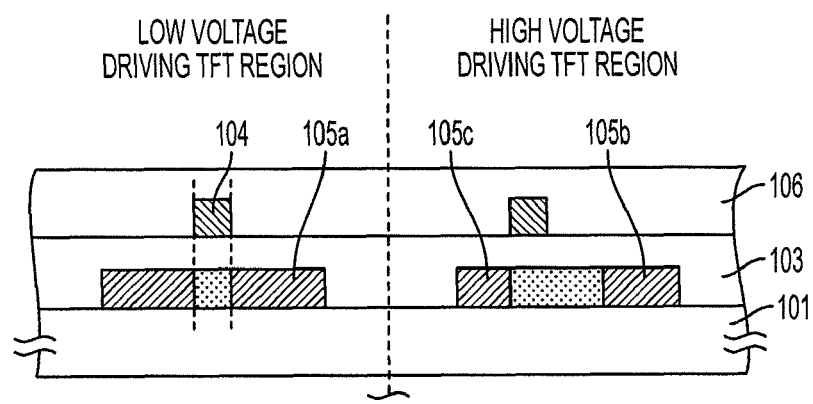
FIGS. 5(a) to (c) are sectional views showing method steps according to the second the second embodiment of the present invention.

FIGS. 4 and 5 are sectional views showing method steps according to a second embodiment of the present invention. The low voltage driving TFT has the same structure as that in the first embodiment. Thus, description thereof is appropriately omitted, and description will be made with respect to a high voltage driving TFT having a sub-gate structure. The sub-gate structure is excellent in output controllability at a low gate voltage, and therefore, is appropriate for a high withstand voltage TFT used for a level shift circuit.

The island-like active layers 102 are formed on a insulating substrate 101 with a laser annealing method. (FIG. 4(a)). Next, an insulating film 103 is deposited (FIG. 4(b)). Subsequently, a first gate electrode 104 and a low voltage gate electrode 110 are formed (FIG. 4(c)). The two electrodes may be formed at the same time. Here, the first gate electrode 104 and the low voltage gate electrode 110 each may be formed as a two-layer structure for lowering of a TFT threshold voltage with high uniformity. The two-layer structure includes a non-single crystalline semiconductor, which is deposited by a plasma enhanced CVD method, for the lower layer, and metal or metal silicide for the upper layer.

Next, a photoresist mask is formed, and impurities are doped into the island-like active layers 102 with the photoresist mask and the gate electrode serving as masks, thereby forming impurity doping regions 105a, 105b, and 105c (FIG. 4(d)). Here, the impurity doping region 105c on the side of the low voltage gate electrode 110 is formed in a self-aligning manner with respect to the gate electrode, and the impurity introducing region 105b on the side of the second gate electrode 107 formed later is formed to have an overlap structure with respect to the gate electrode. The impurity doping regions 105a to 105c each may have an LDD structure with a low concentration region. Subsequently, the gate cover film 106 is deposited (FIG. 5(a)). Then, the impurities are activated by photoirradiation or a rapid heating method in which a heated gas is sprayed. Thereafter, hydrogenation may be performed.

Figure 5B:
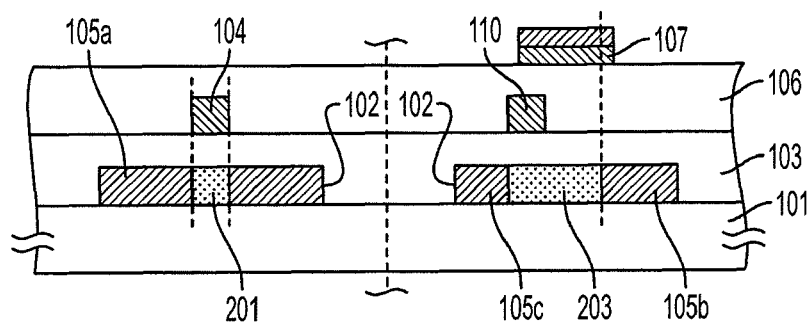
Figure 5C:
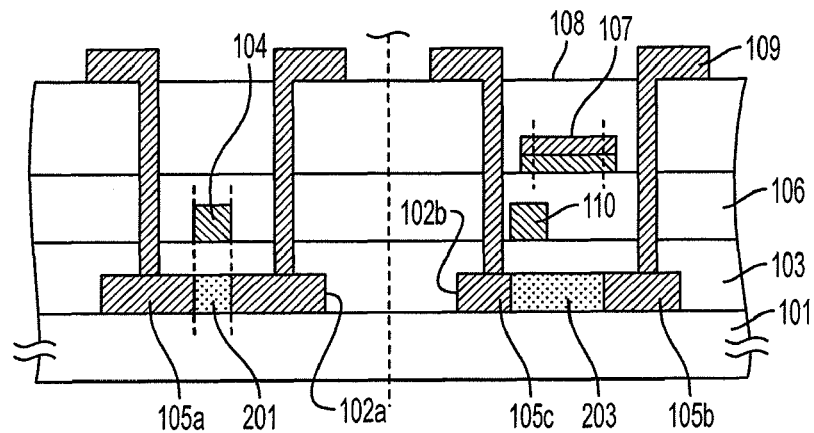

Next, the second gate electrode 107 is formed to have an overlap structure with respect to the impurity doping region 105b (FIG. 5(b)). Subsequently, the interlayer insulating film 108 is deposited, the contact holes are formed, and the metal wirings 109 are formed, whereby the low voltage driving TFT 201 and the high voltage driving TFT 203 with the sub-gate structure are formed (FIG. 5(c)). In the sub-gate structure high-voltage driving TFT 203, the impurity doping region 105c on the side of the low voltage gate electrode 110 serves as a source while the impurity introducing region 105b on the side of the second gate electrode 107 serves as a drain. However, a sub-gate (on the same layer as the second gate electrode) may be provided also on the source side in response to the necessity of a withstand voltage. Thereafter, various wirings, electrodes, interlayer films, and the like are formed if necessary, as a result of which a TFT substrate is formed.

Description will be made of an illustrative first example of the present invention based on the first embodiment with reference to the sectional views showing in FIG. 2 and FIG. 3. For the insulating substrate 101, an $SiO_2$ film with a thickness of 200 nm is deposited as a base film on a none-alkali glass substrate. For the island-like active layers 102, a poly-Si film is used which is obtained such that an amorphous silicon (a-Si) film as a precursor film is deposited to have a thickness of 50 nm, and the film is subjected to scanning irradiation with excimer laser light under the irradiation conditions of a beam diameter of 200×0.4 mm$^2$, an energy density of 350 mJ/cm$^2$, and an overlap ratio of 90%. In the a-Si film, boron for controlling the TFT threshold voltage is doped by an ion implantation method with the condition of a dosage: 8E11 cm$^{-2}$.

For the insulating film 103, an $SiO_2$ film which is deposited by the plasma enhanced CVD method is used. A thickness thereof is set to about 40 nm in order to set the driving voltage of the low voltage driving TFT 201 to 3.3V. For the first gate electrode 104, a two-layer film is used including a lower layer and an upper layer. A microcrystalline silicon (μ c-Si) film is deposited to have a thickness of 70 nm by the plasma enhanced CVD method for the lower layer, and a Cr film is deposited to have a thickness of 100 nm by a sputtering method for the upper layer. A silane ($SiH_4$) gas, a phosphine ($PH_3$) gas, a hydrogen gas, or the like is used as a source gas for the μ c -Si film. Here, a gate wiring width, that is, a channel length is set to 1 μm.

The impurity doping regions 105a, 105b are formed by using an ion doping method, and phosphorous is doped into the n-channel TFT with a dosage of 1E15 cm$^{-2}$ at an acceleration voltage of 40 keV. The thickness of the first gate insulating film has a limit approximately 120 nm taking doping capability of phosphorous into consideration. Boron is doped into the p-channel TFT with a dosage of 2E15 cm$^{-2}$ at an acceleration voltage of 30 keV. Here, the distance between the impurity doping regions 105b of the high voltage driving TFT corresponds to the channel length, is set to 4 μm taking the TFT driving voltage of 20V into consideration. Here, although the impurity is doped into the impurity doping region 105a in a self-aligning manner, the impurity may be doped into the region below the gate in some cases depending on an angle between the substrate and the beam. However, the range is set to about 0.1 μm or less in this embodiment.

For the gate cover film 106, an $SiO_2$ film deposited by the plasma enhanced CVD method is used. A thickness thereof may be 50 nm or more considering of protecting capability of the first gate electrode 104. Here, the thickness of the gate cover film 106 is set to about 110 nm such that the thickness of the gate insulating film totals about 150 nm in consideration of the driving voltage of 20V of the high voltage driving TFT. Next, impurity activation is performed by a laser activation method. Scanning irradiation with excimer laser light is performed under the irradiation conditions of a beam diameter of 200×0.4 mm$^2$, an energy density of 200 mJ/cm$^2$, and an overlap ratio of 90%. Then, hydrogenation is performed by exposing the substrate to hydrogen plasma for 10 minutes.

For the second gate electrode 107, a two-layer film including a lower layer and an upper layer is used. A μ c-Si film, which is deposited to have a thickness of 70 nm by the plasma enhanced CVD method, is used for the lower layer, and a Cr film, which is deposited to have a thickness of 100 nm by the sputtering method, is used for the upper layer. Here, the gate wiring width is set to 5 μm, and an overlap distance with the impurity introducing region 105b is set to about 0.5 μm at each of right and left ends. It is sufficient for the overlap distance to be set to 0.5 μm if the alignment accuracy is considered 0.3 μm or less. The overlap distance is about 2 μm or less in consideration of the parasitic capacitance.

For the interlayer insulating film 108, an SiN film, which is deposited by the plasma enhanced CVD method, is used, and the thickness is set to 400 nm. For the metal wirings 109, an A1-2% Si film is used, and the thickness is set to 600 nm.

Figure 6:
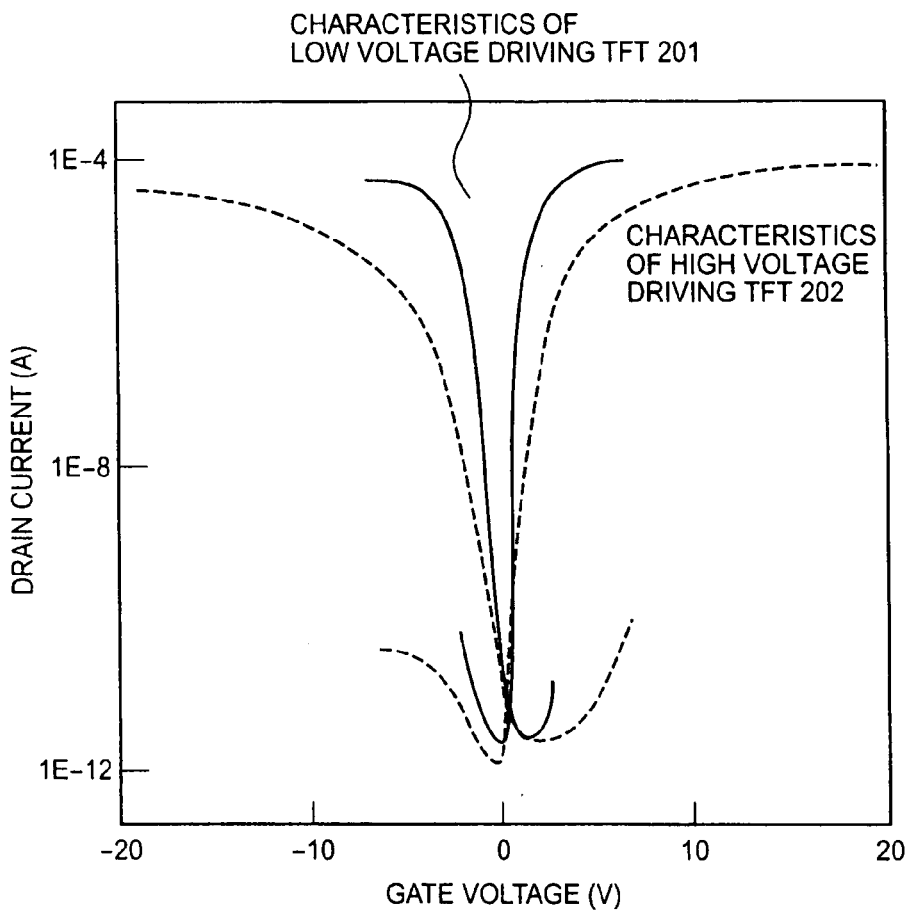
FIG. 6 is a diagram showing TFT characteristics in a first embodiment of the present invention.

Gate voltage-drain current characteristics of the low voltage driving TFT 201 and the high voltage driving TFT 202 formed as described above are shown in FIG. 6. It shows the threshold voltages matched appropriately. Further, it is confirmed that the reliability is high and that an operation time of a hundred thousand hours can be secured. In the case where the first gate electrode 104 and the second gate electrode 107 each are formed of one layer of the Cr film, the threshold voltage is raised by approximately 0.5 to 3V, and a hydrogenation time is increased to 40 minutes in order to obtain equal reliability.

Figure 7:
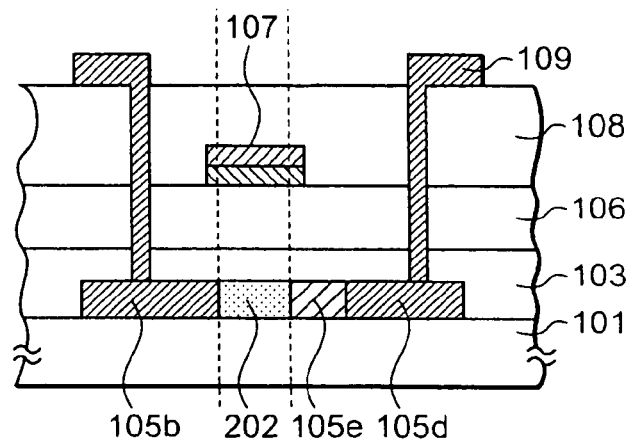
FIG. 7 is a partial sectional view of another example of the first embodiment according to the present invention.

Description will be made of an illustrative second example of the present invention based on the first embodiment with reference to a sectional view of a TFT of FIG. 7. In FIG. 7, the same parts as those in FIG. 3 are denoted by the same reference symbols. A TFT substrate is formed substantially in the same manner as in the first example, but the difference between the second example and the first example is in that the drain of the high voltage driving TFT 202 takes an LDD structure. That is, the drain is formed to be constituted of an impurity doping region 105d, which is a high concentration region, and a low impurity concentration region 105e. Phosphorous or boron is doped into the low impurity concentration region 105e with a dosage of 1E13 cm$^{-2}$ by an ion doping method. The length (length in the section shown in the figure) of the low impurity concentration region 105e is set to 2 μm.

Further, an arc lamp photoirradiation method is adopted as the activation method, and an activation process is performed at 700° C. for 1 minute.

The drain is formed to have the LDD structure. Thus, a leakage current is lowered, a margin of a withstand voltage is increased, and reliability is further enhanced in the high voltage driving TFT 202. The source may take the LDD structure, or a source/drain of the low voltage driving TFT 201 each may take the LDD structure. One or both of the source and the drain may adopt the LDD structure taking the leakage current, withstand voltage, and reliability of the TFT into consideration.

Description will be made of an illustrative third example of the present invention based on the second embodiment with reference to the sectional views shown in FIG. 4 and FIG. 5. For the insulating substrate 101, a substrate is used, which an SiN film with a thickness of 100 nm and an $SiO_2$ film with a thickness of 100 nm are deposited sequentially on a nonealkali glass substrate. For the island-like active layers 102, a poly-Si film is used which is obtained such that an a-Si film as a precursor film is deposited to have a thickness of 60 nm, and then, the film is subjected to scanning irradiation with excimer laser light under the irradiation conditions of a beam diameter of 200×0.4 $mm^2$, an energy density of 380 $mJ/cm^2$, and an overlap ratio of 95%. Boron for controlling the TFT threshold voltage is doped into the a-Si film by an ion implantation method with a dosage: 1E12 $cm^{-2}$.

For the insulating film 103, an $SiO_2$ film, which is deposited by the plasma enhanced CVD method, is used. A thickness thereof is set to about 50 nm in order to set the driving voltage of the low voltage driving TFT 201 to 5V. For the first gate electrode 104 and the low voltage gate electrode 110, a two-layer film including a lower layer and an upper layer is used. A µ c-Si film, which is deposited to have a thickness of 70 nm by the plasma enhanced CVD method, is used for the lower layer, and a WSi film, which is deposited to have a thickness of 150 nm by the sputtering method, is used for the upper layer. Here, a gate wiring width, that is, a channel length is set to about 2 µm. The width of the low voltage gate electrode 110 is also set to about 2 µm.

The impurity doping regions 105a to 105c are formed by using the ion doping method, and phosphorous is doped into the n-channel TFT with a dosage of 1E15 $cm^{-2}$ at an acceleration voltage of 40 keV. Boron is doped into the p-channel TFT with a dosage of 2E15 $cm^{-2}$ at an acceleration voltage of 30 keV. Here, the distance between the impurity doping regions (distance from 105c to 105b) of a sub-gate type high voltage driving TFT 203 is set to about 8 µm taking the driving voltage of 40V on a high voltage side into consideration.

For the gate cover film 106, an $SiO_2$ film deposited by the plasma enhanced CVD method is used. The thickness of the gate cover film 106 is set to about 150 nm such that the thickness of the gate insulating film totals 200 nm in consideration of the driving voltage of 40V on the high voltage side. Next, the impurity is activated by a rapid heating method in which a heated gas is sprayed. A nitrogen gas is used as the gas, and an activation process is performed at 650° C. for two minutes. Then, hydrogenation is performed by exposing the substrate to hydrogen plasma for 12 minutes.

For the second gate electrode 107, a two-layer film is used in which an a µ c-Si film deposited to have a thickness of 70 nm by a plasma enhanced CVD method, is used for the lower layer, and a WSi film deposited to have a thickness of 150 nm by a sputtering method, is used for the upper layer. Here, the gate wiring width is set to 7 µm, and overlap distances with the low voltage gate electrode 110 and with the impurity introducing region 105b each are set to about 0.5 µm. That is, in the sub-gate high withstand voltage TFT 203, a channel length of a channel region in the low voltage gate electrode 110 is 2 µm, and a channel length of a channel region in the high voltage second gate electrode 107 is 6 µm.

For the interlayer insulating film 108, an $SiO_2$ film is deposited by a plasma enhanced CVD method, and the thickness is set to 400 nm. For the metal wirings 109, an Al-2% Si film is used, and the thickness is set to 800 nm. Accordingly, the low voltage driving TFT 201 and the high voltage driving TFT 203 with the sub-gate structure can be formed simultaneously.

Figure 8:
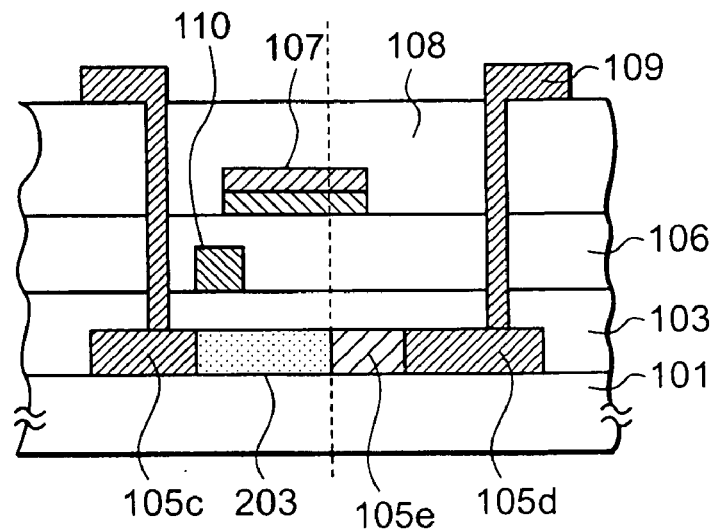
FIG. 8 is a partial sectional view of another example of the second embodiment according to the present invention.
Figure 9:
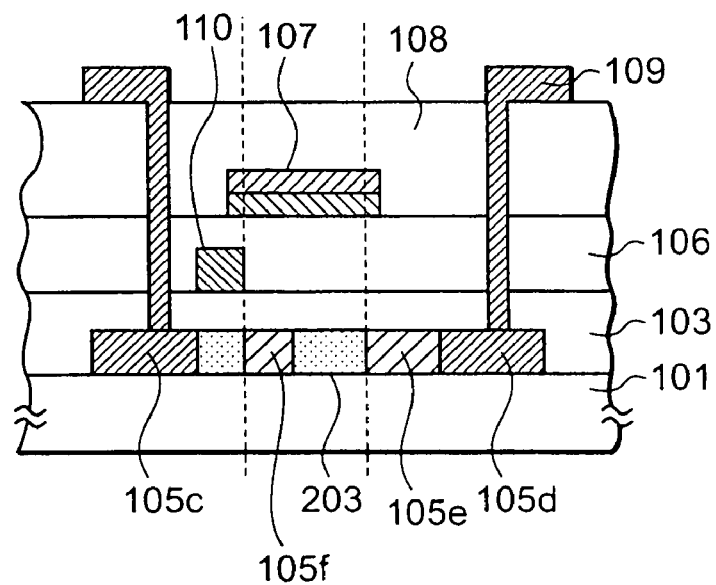
FIG. 9 is a partial sectional view of another example of the second embodiment of the present invention.
Figure 10:
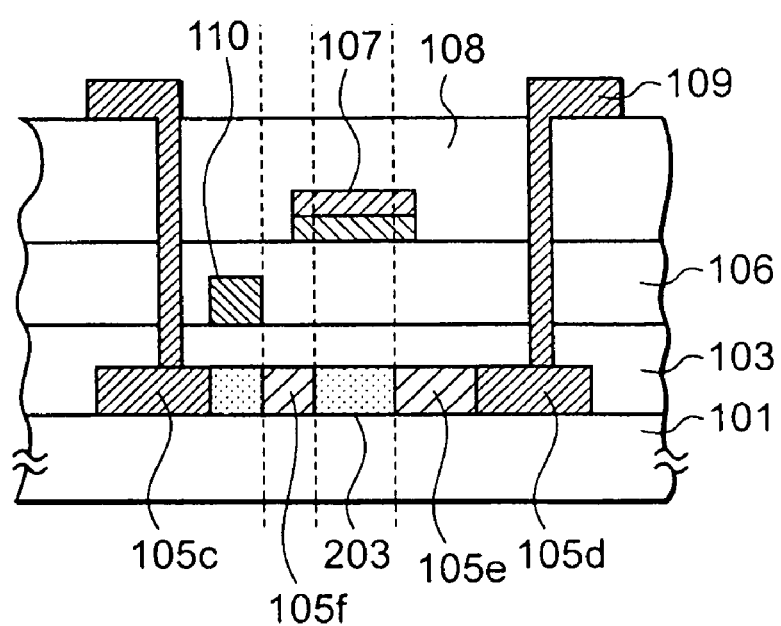
FIG. 10 is a partial sectional view of another example of the second embodiment of the present invention.

FIG. 8, FIG. 9, and FIG. 10 are sectional views showing for an illustrative fourth, fifth, and sixth embodiments of the present invention based on the second embodiment. In FIGS. 8 to 10, the same parts as those in FIG. 5 and FIG. 7 are denoted by the same reference symbols.

As shown in FIG. 8, in the fourth example, the sub-gate structure high-voltage driving TFT 203 is formed as in the third example, but a drain is formed to have an LDD structure here. That is, the drain is formed to be constituted of the impurity doping region 105d, which is the high concentration region, and the low impurity concentration region 105e. The method of forming the LDD structure is the same as that in the second example. The length (length in the section shown in the FIG. 8) of the low impurity concentration region 105e is approximately 0.5 to 2 µm.

FIG. 9 shows the fifth example, wherein the sub-gate structure high voltage driving TFT 203 is formed as in the fourth embodiment. However, the drain is formed to have an LDD structure, and in addition, a low impurity concentration region 105f is formed in a channel region in a self-aligning manner with respect to the low voltage gate electrode 110. The low impurity concentration region 105f is formed of the same conductivity type and is at the same concentration as in the low impurity concentration region 105e, Here, the length of each of the low impurity concentration regions 105e and 105f is approximately 0.5 to 2 µm.

FIG. 10 shows the sixth embodiment, wherein the drain is formed to have an LDD structure as in the fifth embodiment, and the low impurity concentration region 105f is formed in the channel region. The low impurity concentration region 105f is formed of the same conductivity type and is at the same concentration as in the low impurity concentration region 105e. Here, the second gate electrode 107 is formed to be offset with respect to the low voltage gate electrode 110. The offset amount may be a length of the low impurity concentration region 105f or less (about 0.5 to 2 µm ). Image Page 3

Figure 11:
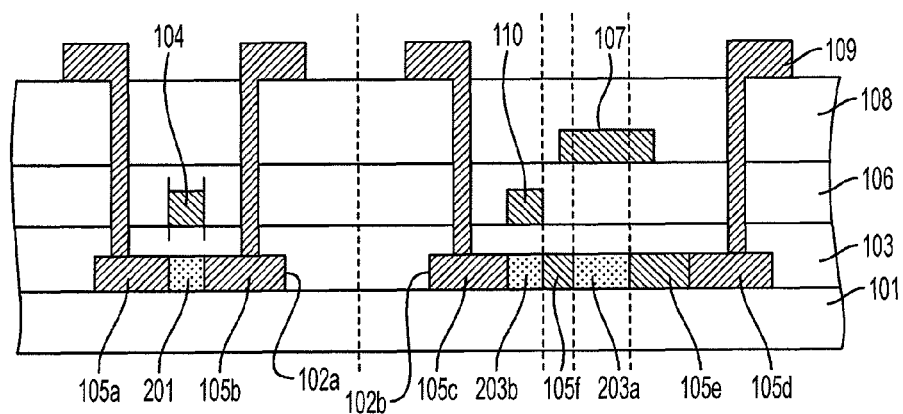
FIG. 11 is a sectional view of an illustrative embodiment of the present invention.

FIG. 11 is a sectional view of an illustrative embodiment of the present invention. FIG. 11 illustrates a combination of FIG. 5(c) and FIG. 10, wherein the reference numerals 203a and 203b have been employed to more clearly reference the first and second channel regions, respectively. As shown in FIG. 11, a second gate electrode 107 is disposed above a first channel region 203a. Further, the low voltage gate electrode 110 is disposed above a second channel region 203b. As shown in FIG. 11, an impurity concentration region 105f is disposed between the first channel region 203a and the second channel region 203b such that a portion of the impurity concentration region 105f is not directly below either the low voltage gate electrode 110 or the second gate electrode 107.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments without the use of inventive faculty. Therefore, the present invention is not intended to be limited to the embodiments described herein but is to be accorded the widest scope as defined by the limitations of the claims and equivalents.

What is claimed is:

1. A thin film transistor substrate comprising:
an insulating substrate;
a first thin film transistor formed above said insulating substrate, wherein said first thin film transistor comprises a first active layer formed above said insulating substrate, a first gate insulating film formed on said first active layer, and a first gate electrode formed on said first gate insulating film; and
a second thin film transistor formed above said insulating substrate, wherein said second thin film transistor comprises a second active layer formed above said insulating substrate, a second gate insulating film formed on said second active layer, and a second gate electrode formed on said second gate insulating film,
wherein said second gate insulating film comprises said first gate insulating film and a gate cover film formed above said first gate insulating film,
wherein said second active layer has at least two impurity doping regions which
overlap said second gate electrode,
wherein said first active layer has at least two impurity doping regions formed in a self aligning manner with respect to said first gate electrode,
wherein said second thin film transistor further comprises a third gate electrode, wherein a gate length of said third gate electrode is shorter than a gate length of said second gate electrode, wherein said third gate electrode is formed between said second active layer and said second gate electrode and on the first gate insulating film,
wherein said impurity doping regions formed in a self aligning manner are formed so as to overlap said first gate electrode by 0.1 μm or less, and
wherein said second active layer comprises a first channel region disposed directly below said second gate electrode, a second channel region disposed directly below said third gate electrode and wherein one of said impurity doping regions overlapping said second gate electrode is disposed between said first and second channel regions and has a portion not directly below either said second gate electrode or said third gate electrode.

2. The thin film transistor substrate according to claim 1, wherein at least one of said impurity doping regions formed in a self-aligning manner with respect to said first gate electrode includes an LDD structure.

3. The thin film transistor substrate according to claim 1, wherein at least one of impurity doping regions which overlap said second gate electrode includes an LDD structure.

4. The thin film transistor substrate according to claim 1 wherein said impurity doping regions which overlap said second gate electrode are formed so as to overlap said second gate electrode by 2.0 μm or less.

5. The thin film transistor substrate according to claim 1 wherein said third gate electrode comprises a two-layer structure including a semiconductor layer and a metal or a metal silicide layer.

6. The thin film transistor substrate according to claim 1, wherein said second gate electrode comprises a semiconductor layer.

7. The thin film transistor substrate according to claim 1, wherein said third gate electrode is formed of the same material as said first gate electrode, and
wherein said third gate electrode has the same thickness as said first gate electrode.

8. The thin film transistor substrate according to claim 1, wherein said first gate electrode, said second gate electrode and said third gate electrode are formed under wires which connect to said impurity doping regions.

9. The thin film transistor substrate according to claim 3, wherein said impurity doping region disposed between said first and second channel regions has a doping concentration and conductivity type of said LDD structure.

10. The thin film transistor substrate according to claim 1, wherein said first channel region, said second channel region and said impurity doping region disposed between said first and second channel regions are configured in a plane configuration.

* * * * *